(12) United States Patent
Dudeck et al.

(10) Patent No.: US 7,558,095 B2
(45) Date of Patent: Jul. 7, 2009

(54) MEMORY CELL FOR CONTENT-ADDRESSABLE MEMORY

(75) Inventors: Dennis E. Dudeck, Hazleton, PA (US); Donald Albert Evans, Lancaster, OH (US); Hai Quang Pham, Hatfield, PA (US); Wayne E. Werner, Coopersburg, PA (US); Ronald James Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 104 days.

(21) Appl. No.: 11/743,163

(22) Filed: May 2, 2007

(65) Prior Publication Data

US 2008/0273361 A1    Nov. 6, 2008

(51) Int. Cl.
    *G11C 15/00*    (2006.01)
(52) U.S. Cl. ............... 365/49.1; 365/49.11; 365/49.17; 365/49.18
(58) Field of Classification Search ................... 365/49, 365/189.07, 230.02, 230.06, 49.1, 189.05
    See application file for complete search history.

(56) References Cited

U.S. PATENT DOCUMENTS 6,046,923 A * 4/2000 Evans ...................... 365/49.18
7,304,874 B2 * 12/2007 Venkatraman et al. ..... 365/49.1

OTHER PUBLICATIONS

Pagiamtzis, K., Content-Addressable Memory (CAM) Circuits and Architectures: A Tutorial and Survey, IEEE Journal of Solid-State Circuits, Mar. 2006, pp. 712-727, vol. 41, No. 3.

* cited by examiner

*Primary Examiner*—Pho M. Luu
*Assistant Examiner*—Tha-O Bui
(74) *Attorney, Agent, or Firm*—Ryan, Mason & Lewis, LLP

(57) ABSTRACT

A memory cell for use in a content-addressable memory comprises a first latch and a second latch. The first latch is operative to store a first bit associated with a first stored word, while the second latch is operative to store a second bit associated with a second stored word. The first and second latches collectively comprise a plurality of latch transistors. Each of the latch transistors comprises a respective channel. The channels of the latch transistors are oriented in substantially the same direction, resulting in a very compact memory cell implementation.

20 Claims, 4 Drawing Sheets

MEMORY CELL FOR CONTENT-ADDRESSABLE MEMORY

FIELD OF THE INVENTION

This invention relates generally to content-addressable memories (CAMs), and, more particularly, to designs for improving CAM size, performance, and power consumption.

BACKGROUND OF THE INVENTION

A CAM is a particular type of random access memory (RAM) that can be written to and read from like a standard RAM, but can also be quickly searched for specific content. In particular, a CAM can be searched for a set of consecutive memory cells that have a specified string of data values. Typically, the size of the search string corresponds to the data word length of the CAM, and the search is performed in parallel in all stored words (e.g., in a single clock cycle). If the search string is found in the CAM, the CAM outputs the address of the stored word where the search string exists. If the search string exists in two or more stored words, the search will identify only one of them (e.g., the one with the lowest address).

FIG. 1, for example, shows a schematic diagram of the architecture of a CAM 100 containing four stored words W0-W3, each having three bits. Each bit is programmed into memory cells 110 using word lines and bit lines that are not explicitly shown in the figure. Match lines ML0-ML3 run horizontally through the stored words and terminate in match line sense amplifiers 120. Pairs of differential search-data lines MDLT0-MDLT2 and MDLC0- MDLC2 (where "T" designates true and "C" designates complement) run vertically through the memory cells and terminate in a search data register 130. A content search operation begins by loading the search string into the search data register followed by precharging all the match lines high, thereby putting them temporarily into the match state. Next the search data register broadcasts the search string into the differential search-data lines, and each memory cell compares its stored bit against the bits on its corresponding search-data lines. Match lines on which all bits match remain in the precharged-high state. Match lines with at least one bit that do not match discharge to ground. The match line sense amplifiers then detect whether their respective match lines have a match condition or miss condition. Finally, an encoder 140 maps the match line of the matching location to its encoded address.

CAMs can be used in a wide variety of applications requiring high search speeds. CAMs are used extensively, for example, to classify and forward Internet Protocol (IP) packets in network routers. The function of a network router is to compare the destination address of a packet to all possible routes in order to choose the appropriate route. A CAM is a good choice for implementing this lookup operation due to its relatively fast search capability.

However, the speed of a conventional CAM comes at the cost of increased silicon area and power consumption when compared to many other RAM technologies. Both the speed of a CAM and its power consumption are typically a function of a CAM's size. As a CAM becomes smaller, the resistances of those circuit elements constituting the CAM likewise become smaller. Moreover, the distances signals must travel in the CAM and the capacitive loading on the circuit elements of the CAM also tend to decrease. Capacitive coupling (e.g., crosstalk) between nearby circuit elements also typically decreases with CAM size.

As a result, there remains a need for new area-efficient CAM designs with improved performance and power consumption characteristics over conventional designs.

SUMMARY OF THE INVENTION

Embodiments of the present invention address the above-identified need by providing CAM designs allowing bits associated with different stored words to be stored in single, area-efficient memory cells.

In accordance with an aspect of the invention, a memory cell for use in a CAM comprises a first latch and a second latch. The first latch is operative to store a first bit associated with a first stored word, while the second latch is operative to store a second bit associated with a second stored word. The first and second latches collectively comprise a plurality of latch transistors. Each of the latch transistors comprises a respective channel. The channels of the latch transistors are oriented in substantially the same direction.

In accordance with one of the above-identified embodiments of the invention, a CAM comprises an array of memory cells arranged into rows and columns. Each memory cell comprises two SRAM latches for storing two bits associated with two different words and two exclusive-or (XOR) gates for searching the data stored in the SRAM latches. The SRAM latches each contain six transistors and the XOR gates each contain four transistors. Advantageously, the channels of the transistors of the SRAM latches and the XOR gates are oriented in the same direction as one another, allowing for an extremely compact implementation of the memory cell. Moreover, the layout of the memory cell allows the use of shared vertical vias between adjacent memory cells, match line isolation techniques, and bit line segmentation, each further enhancing the performance and power consumption properties of the CAM.

These and other features and advantages of the present invention will become apparent from the following detailed description which is to be read in conjunction with the accompanying drawings.

DETAILED DESCRIPTION OF THE INVENTION

The present invention will be described with reference to illustrative embodiments. For this reason, numerous modifications can be made to these embodiments and the results will still come within the scope of the invention. No limitations with respect to the specific embodiments described herein are intended or should be inferred.

Figure 2:
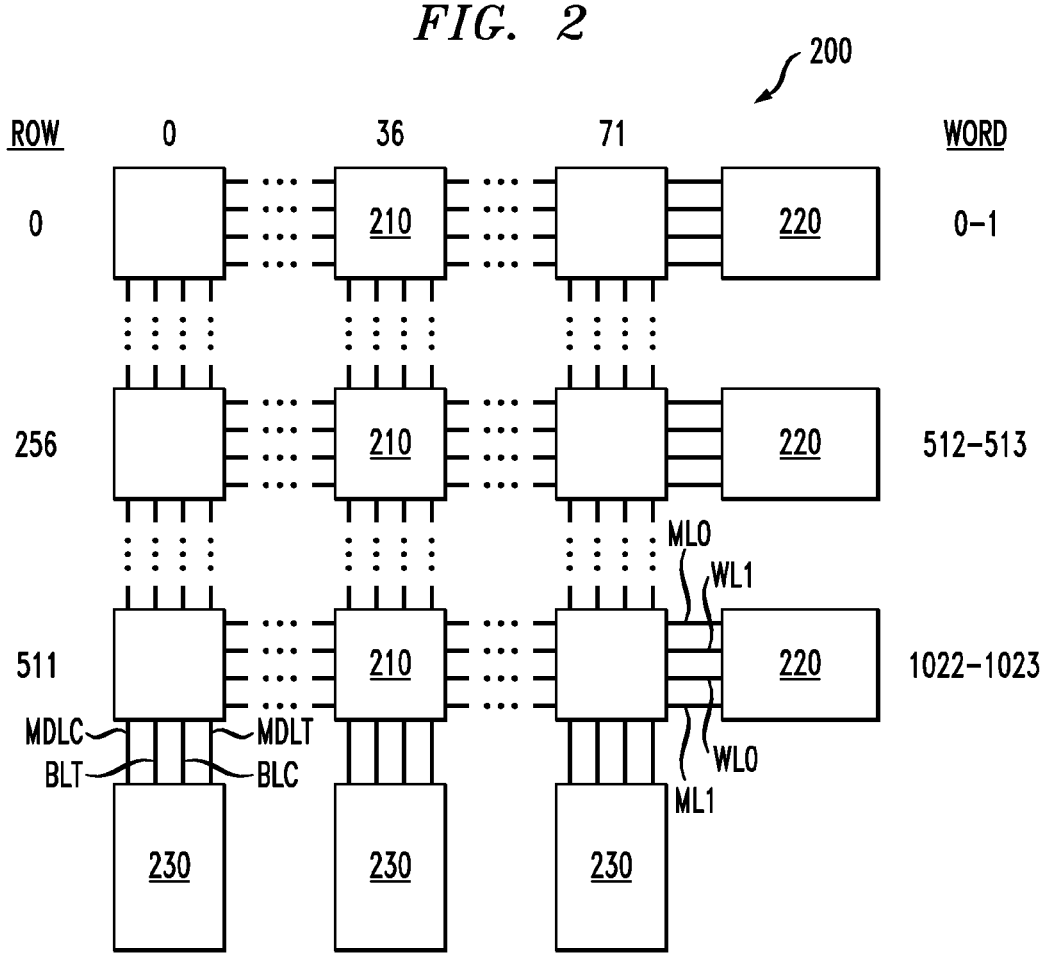
FIG. 2 shows a schematic diagram of the architecture of a CAM in accordance with an illustrative embodiment of the invention.

FIG. 2 shows a schematic diagram of the architecture of a CAM 200 in accordance with an illustrative embodiment of the invention. The CAM includes an array of memory cells 210 arranged in rows and columns and is operative to store and search words in a manner similar to a conventional CAM. Unlike a conventional CAM, however, each memory cell in the CAM 200 is capable of storing and searching two bits of data associated with two different stored words rather than storing a single bit associated with a single stored word. For illustrative purposes, the CAM 200 is shown to support 1,024 72-bit stored words. Nevertheless, this capacity is merely illustrative and should not be construed as limiting the scope of the invention.

Access to each memory cell 210 in the array of the CAM 200 is provided via two word lines WL0 and WL1, two match lines ML0 and ML1, a differential pair of bit lines BLT and BLC, and a differential pair of search-data lines MDLT and MDLC. The word lines and match lines are shared by each memory cell in a given row in the CAM. The bit lines and search-data lines, in contrast, run in a direction orthogonal to that of the word lines and match lines and are shared by each memory cell in a given column. The word lines and match lines terminate in row support circuitry 220 and the bit lines and search-data lines terminate in column support circuitry 230. Those skilled in the art will understand that the row and column support circuitry includes sense amplifiers, input latches, output drivers, and other components needed to access the array of memory cells in the manner indicated below.

Figure 3:
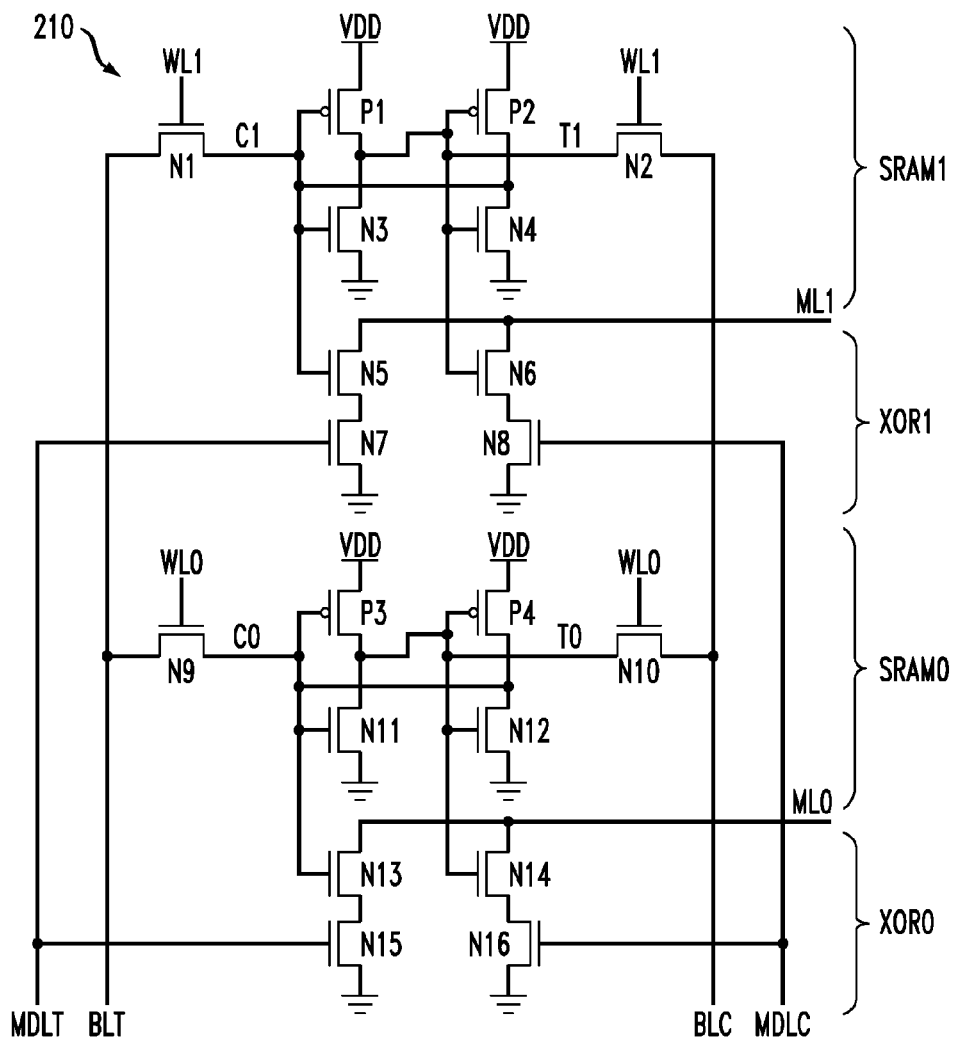
FIG. 3 shows a schematic diagram of an illustrative memory cell in the FIG. 2 CAM.

FIG. 3 shows a schematic diagram of a representative memory cell 210 within the CAM 200. The memory cell comprises first and second SRAM latches SRAM0 and SRAM1, respectively, in combination with first and second XOR gates XOR0 and XOR1, respectively. The latches are used to store data while the logic gates allow the stored contents of the latches to be searched as part of the content search capabilities of the CAM. Each SRAM latch contains six metal-oxide-semiconductor field effect transistors (MOSFETs) configured as two cross-coupled digital inverters with two access transistors for reading and writing. In particular, the first SRAM latch SRAM0 comprises n-type MOSFETs (NFETs) N9-N12 and p-type MOSFETs (PFETs) P3 and P4, while the second SRAM latch SRAM1 comprises NFETs N1-N4 and PFETs P1 and P2. The PFETs are located in an n-type well NWELL. The first and second XOR gates XOR0, XOR1, in comparison, each contain four NFETs (N13-N16 for XOR0, and N5-N8 for XOR1).

The word lines WL0, WL1 and bit lines BLT, BLC are used to write data to and read data from the SRAM latches SRAM0, SRAM 1 in the representative memory cell 210. To write new data to the first SRAM latch SRAM0, for example, output drivers are activated in the column support circuitry 230 corresponding to the location of the representative memory cell to temporarily drive the bit lines to the intended storage values. In addition, output drivers in the row support circuitry 220 corresponding to the location of the memory cell are activated to temporarily drive the first word line WL0 to a high state (e.g., supply voltage VDD), thereby turning on access NFETs N9 and N10. During the write operation, the voltage on complement bit line BLC is the complement of the voltage on true bit line BLT. Driving the true bit line low and the complement bit line high stores a memory state "1" in the memory cell, while the opposite acts to store a memory state "0." If the output drivers in the column support circuitry used to drive the bit lines are larger than the transistors used in the memory cell, they will override the previous state of the cross-coupled digital inverters in the first SRAM latch.

When reading data from the first SRAM latch SRAM0 in the representative memory cell 210, bit lines BLT, BLC are initially precharged high and then configured into a high impedance state. The first word line WL0 is then again activated and access NFETs N9 and N10 are temporarily turned on so that the voltages on the outputs of the digital inverters can be sensed. The digital inverters act to discharge either true bit line BLT or complement bit line BLC to ground potential (e.g., ground voltage VSS) depending on the stored state of the memory cell. Thus, when reading the SRAM latch, the digital inverters in the latch drive the bit lines. The states of the bit lines are subsequently sensed by sense amplifier circuitry in the column support circuitry 230 to determine the storage state of the just-read SRAM latch.

As will be apparent to one skilled in the art, bit lines BLT, BLC are also used to write data to and read data from the second SRAM latch SRAM1 in the representative memory cell 210. In this case, however, the second word line WL1 is activated during these operations rather than the first word line WL0.

In contrast to reading and writing, content searching in the representative memory cell 210 in the CAM 200 is achieved using the match lines ML0, ML1 and search-data lines MDLT, MDLC. Two match lines are used for each memory cell because the memory cell stores two bits of data associated with two different stored words. Initially the match lines are precharged high and the search-data lines are precharged low. The search-data lines are then set to values corresponding to the value of the search string at the particular column in which the representative memory cell is located. When the corresponding search string value is a binary value "1," the true search-data line MDLT is set high and the complement search-data line MDLC is allowed to remain low, and if the search string value is a binary value "0," the true search-data line MDLT is allowed to remain low and the complement search-data line MDLC is set high. If the memory state of the first SRAM latch SRAM0 matches that of the corresponding search-string value on the search-data lines, the first match line ML0 remains in the high state. If there is a mismatch, the first match line is discharged to low through the first XOR gate XOR0. Likewise, the second match line ML1 is either maintained high or discharged as a result of the match between the memory state of the second SRAM latch SRAM1 and the search string value for the particular column.

The first and second match lines ML0, ML1 are coupled to each memory cell 210 in a given row of the CAM 200. As a result, the match line corresponding to a given stored word will be discharged low if any memory cell in a stored word does not match its corresponding search string value, thereby indicating that no match exists for that stored word. If however, each memory cell in the row matches its corresponding search string value, the match line will remain in the high state, indicating a match. In this way, the CAM 200 displays a content search functionality similar to that of a conventional CAM (e.g., the CAM 100) while utilizing only a single row of memory cells for two stored words.

Figure 4:
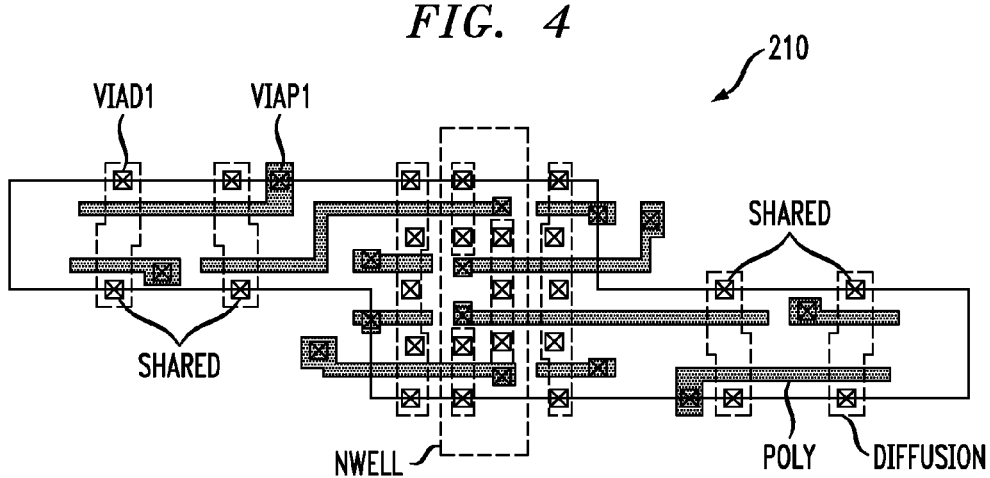
FIGS. 4-7 show layout views of various levels in the FIG. 3 memory cell.
Figure 5:
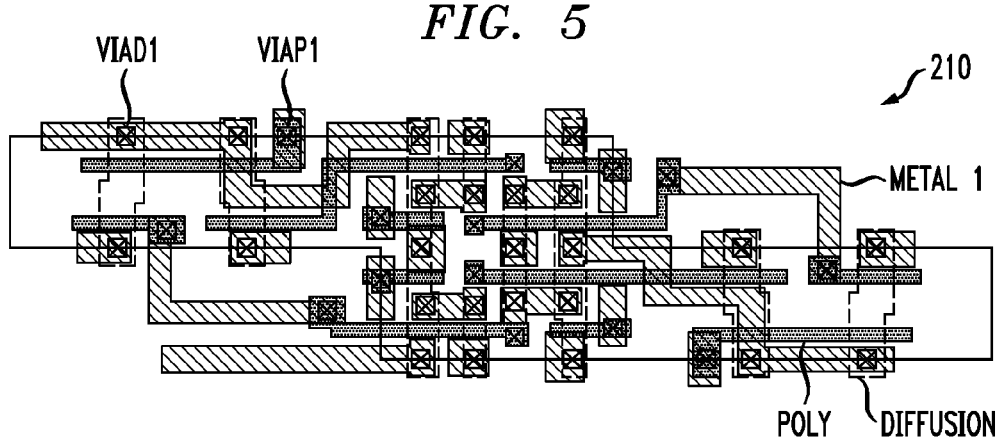
Figure 6:
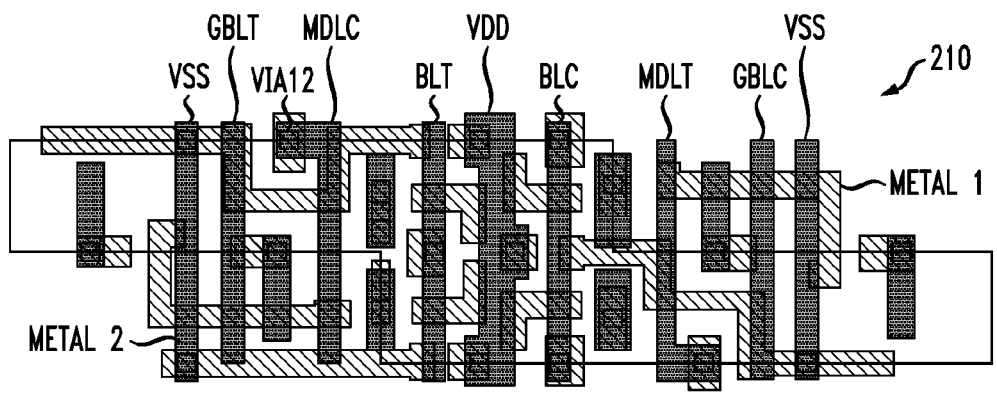
Figure 7:
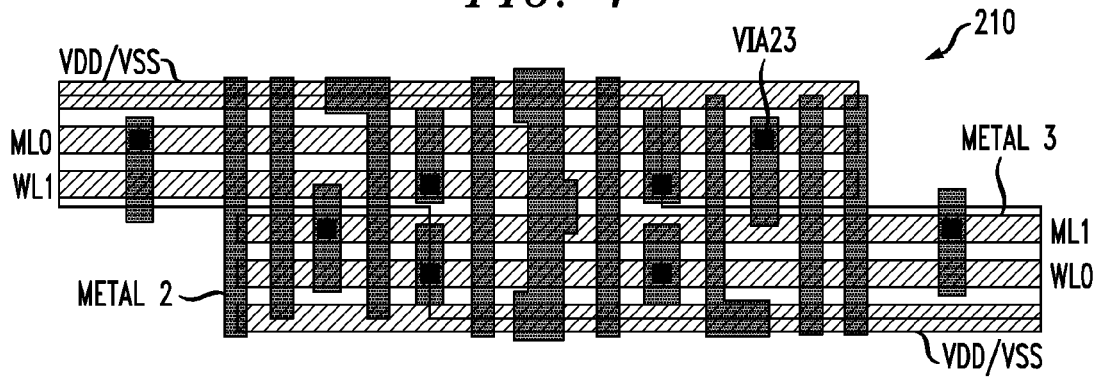

FIGS. 4-7 show illustrative layout views of the representative memory cell 210 in the CAM 200. More specifically, FIG. 4 shows a layout view of a diffusion level and a polysilicon (poly) level, FIG. 5 shows the FIG. 4 layout with the addition of a first metallization level (METAL 1), and FIG. 6 shows the METAL 1 level with the addition of a second metallization level (METAL 2). Finally, FIG. 7 shows the METAL 2 level with the addition of a third metallization level (METAL 3). In these figures, vertical vias between levels are denoted by squares labeled as "VIAXY" where X and Y are the levels across which the vertical vias are coupled. In this notation, "D" is used to designate the diffusion level, "P" is used to designate the polysilicon level, and numbers (1, 2, or 3) are used to designate the corresponding metallization levels.

Figure 8:
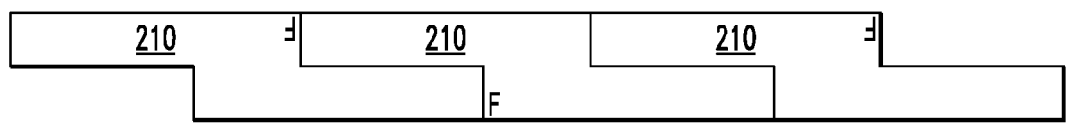
FIG. 8 shows a layout view of three FIG. 3 memory cells formed into a row.

FIG. 8, moreover, shows the orientation of three memory cells 210 relative to one another when they are combined to form a row in the CAM 200.

As can be seen in FIGS. 4-8, the memory cell 210 occupies a region that can be described by two commonly oriented and partially abutting rectangles. The twelve transistors (i.e., eight NFETs and four PFETs) belonging to the first and second SRAM latches SRAM0, SRAM1 are located proximate to the center of the memory cell (i.e., in that region where the two rectangles abut). The eight transistors belonging to the XOR gates XOR0, XOR1 are located in the upper left and lower right regions of the memory cell. Metal lines acting as the bit lines BLC, BLT, search-data lines MDLC, MDLT, and ground lines (VSS) are found in the METAL 2 level. As expected, these metal lines cross vertically through the memory cell in the direction of a column. Metal lines acting as the word lines WL0, WL1, match lines ML0, ML1, and power/ground lines (VDD/VSS) are found in the METAL 3 level and pass horizontally through the memory cell in the direction of a row.

One skilled in the art will recognize that the memory cell layout shown in FIGS. 4-8 has several advantages with respect to CAM size, performance, and power consumption. Reference to FIG. 4, for example, shows that the channels of the NFETs and PFETs constituting the SRAM latches SRAM0, SRAM1 are oriented in the same direction as one another (i.e., in the direction of a column), thereby allowing their polysilicon gate lines to travel in substantially the same direction (i.e., in the direction of a row). This type of SRAM layout is commonly referred to as a "unidirectional polysilicon gate" configuration. It allows a layout of two SRAM latches that is substantially more compact, especially in the vertical direction (i.e., the direction of the bit lines), than a conventional layout that uses transistors oriented in two orthogonal directions. Moreover, the channels of NFETs forming the XOR gates XOR0, XOR1 are also oriented in the same direction as the channels of transistors constituting the SRAM latches. This allows the XOR gates to be incorporated into the memory cell without requiring that the vertical length of the memory cell be extended beyond that required to accommodate the two SRAM latches. The two types of devices are thereby combined in a very area efficient manner.

In addition, reference to FIG. 8 shows that a given memory cell 210 in a row is rotated by 180 degrees in relation to the memory cells immediately to its left and immediately to its right. Advantageously, this allows four vertical vias to the diffusion level VIAD1, labeled as "shared" in FIG. 4, to be shared between horizontally adjacent memory cells. Two of the shared vertical vias are connected to the first match line ML0 in the METAL 2 level, and the remaining two shared vertical vias are connected to the second match line ML1. As a result, the number of vertical vias acting on the first and second match lines per memory cell is effectively reduced by one with this configuration. This reduction in the number of vertical vias acting on the match lines reduces the capacitive loading on the match lines. The performance of the match lines is substantially enhanced in this manner.

Match line performance is also enhanced by the configuration of metal lines in the METAL 3 level. FIG. 7 shows that the first and second match lines ML0, ML1 are separated by the second word line WL1. During content search operations, the second word line is typically held in a low state. The presence of this low-state word line between the first and second match lines as well as the non-adjacent configuration of the match lines tends to reduce the amount of capacitive coupling (i.e., crosstalk) between these match lines. Capacitive coupling may cause the signal on one match line to affect the timing of the signal on the other match line and is typically a critical design issue when designing SRAM and CAM memory cells. Again, match line performance is substantially enhanced by using a configuration in accordance with aspects of the invention.

As an additional benefit of the layout described in FIGS. 4-8, one will recognize the availability of a pair of differential global bit lines GBLT and GBLC passing vertically through the representative memory cell 210 in the METAL 2 level. These global bit lines allow for the use of bit line segmentation techniques. One skilled in the art will recognize that each row in the CAM 200 contributes capacitance and resistance to the bit lines used for reading and writing data to and from the individual memory cells, which, in turn, increases the impedance on the bit lines and decreases the speed of that data access. This effect is especially prevalent with modern technology processes which tend to produce higher bit line leakage currents. When a CAM has a relatively large number of rows, the bit line loading may result in unacceptably poor CAM performance. Bit line segmentation allows these effects to be substantially mitigated. Of course, bit line segmentation only acts to enhance the benefits in bit line performance already created by the use of unidirectional SRAM latches in the core of the memory cells. As mentioned earlier, such memory cells already have a relatively small dimension in the bit line direction.

Figure 9:
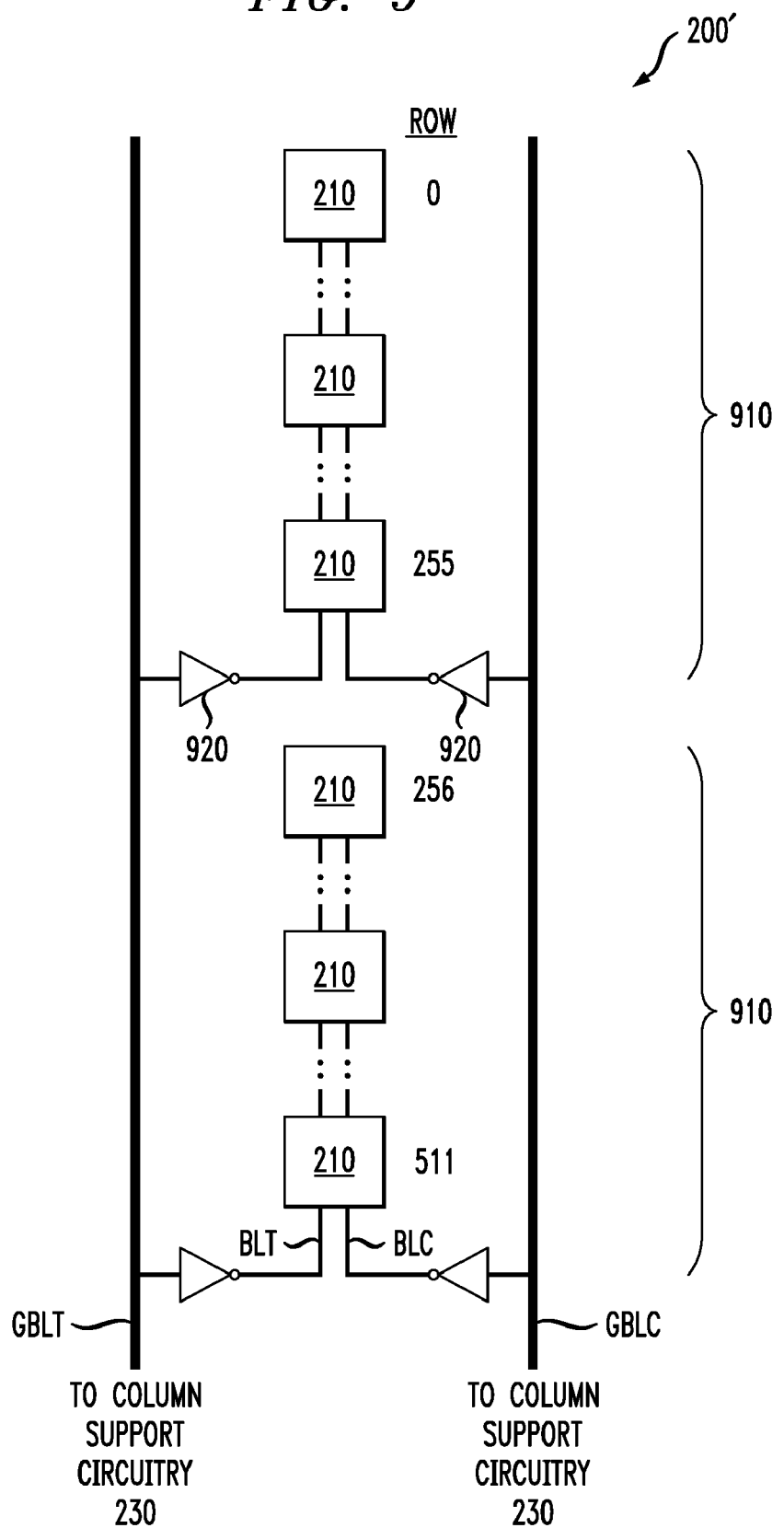
FIG. 9 shows a schematic diagram of the architecture of a column in a variant of the FIG. 2 CAM with bit line segmentation.

FIG. 9 shows a schematic diagram of the architecture of given column in a CAM 200' with bit line segmentation. Such an architecture is considered to be an optional variant on the architecture shown in FIG. 2, which did not include bit line segmentation. The memory cells 210 constituting the CAM 200' are identical to those described above. However, in the CAM 200', each column of memory cells is divided into two smaller cell blocks 910, although this particular number of cell blocks is merely illustrative. The memory cells in each cell block are served by the pair of differential bit lines BLT, BLC (now called "local" bit lines) that run the length of a cell block rather than the length of an entire column as they do in the CAM 200. The global bit lines GBLT, GBLC, in contrast, run the length of an entire column and are attached to the column support circuitry 230 for each column. A gap row is added between the cell blocks containing buffer circuits 920 (e.g., write drivers and sense amplifiers) which act to buffer the global bit lines to the local bit lines.

The use of bit line segmentation in a manner similar to that used in the CAM 200' may allow a CAM to have substantially more capacity and better performance than a CAM without bit line segmentation. Utilizing global bit lines GBLT, GBLC in combination with local bit lines BLT, BLC greatly reduces the capacitive and resistive loadings on the global bit lines. This allows a larger CAM and improved CAM performance with respect to reading and writing operations.

Figure 1:
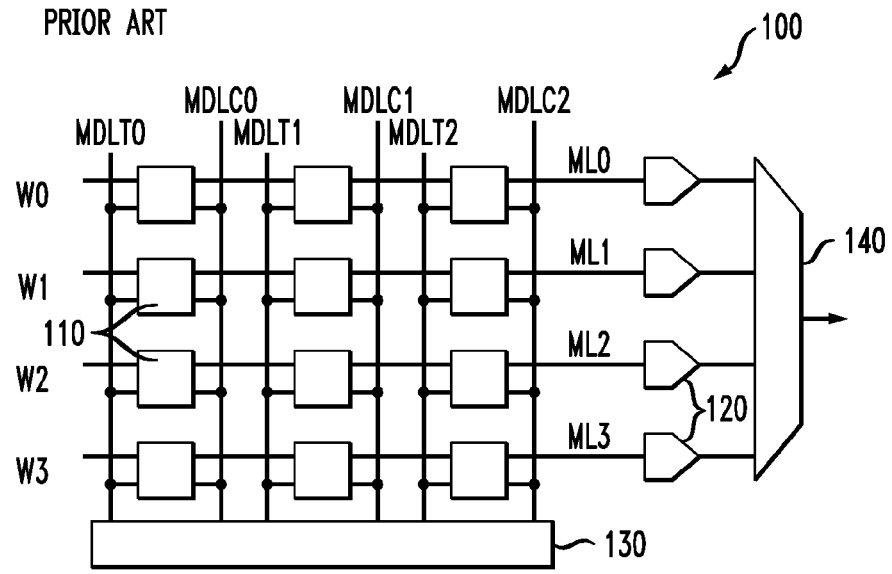
FIG. 1 shows a schematic diagram of the architecture of a conventional CAM.

Embodiments of this invention may comprise integrated circuits comprising CAMs in accordance with aspects of the invention, such as CAMs like the CAM 200 in FIG. 1. The function and formation of such integrated circuits will be familiar to one skilled in the art. Moreover, embodiments of this invention may comprise other apparatus that comprise such CAMs. Such apparatus embodiments may include, but are not limited to, data networking devices (e.g., network routers, filters, and switches), memory mapping devices (e.g., central processing unit cache controllers and translation lookaside buffers), and data compression devices.

It should again be emphasized that the above-described embodiments of the invention are intended to be illustrative only. Other embodiments can use different types and arrangements of elements for implementing the described functionality. For example, rather than using SRAM-based latches, a memory cell in accordance with aspects of the invention could use dynamic random access memory-based latches for data storage. Alternatively or additionally, logic gates other than XOR gates may be used to provide a memory cell with content search capabilities. These numerous alternative embodiments within the scope of the following claims will be apparent to one skilled in the art.

What is claimed is:

1. A memory cell for use in a content-addressable memory, the memory cell comprising:
    a first latch, the first latch operative to store a first bit associated with a first stored word;
    a second latch, the second latch operative to store a second bit associated with a second stored word;
    a first logic gate, the first logic gate coupled to the first latch; and
    a second logic gate, the second logic gate coupled to the second latch;
    wherein the first and second latches collectively comprise a plurality of latch transistors, each of the plurality of latch transistors comprising a respective channel, the channels being oriented in substantially the same direction; and
    wherein the memory cell comprises a central portion in which the first and second latches are implemented, and first and second side portions arranged on opposite sides of the central portion, the first and second logic gates being implemented in the side portions.

2. The memory cell of claim 1, wherein at least one of the first and second latches comprises a static random access memory latch.

3. The memory cell of claim 1, wherein at least one of the first and second latches comprises four n-type metal-oxide-semiconductor field effect transistors (MOSFETs) and two p-type MOSFETs.

4. The memory cell of claim 1, wherein the plurality of latch transistors is switched using eight discrete gate lines.

5. The memory cell of claim 1, wherein at least one of the first and second logic gates comprises four transistors.

6. The memory cell of claim 1, wherein at least one of the first and second logic gates comprises an exclusive-or logic gate.

7. The memory cell of claim 1, wherein the first and second logic gates collectively comprise a plurality of logic gate transistors, each of the plurality of logic gate transistors comprising a respective channel, the channels of the logic gate transistors being oriented in substantially the same direction as the channels of the plurality of latch transistors.

8. The memory cell of the claim 7, wherein the plurality of logic gate transistors is switched using eight discrete gate lines.

9. The memory cell of claim 1, wherein the memory cell occupies an area defined by two commonly oriented and partially abutting rectangular regions.

10. The memory cell of claim 1, wherein the memory cell includes a metallization level comprising:
    a first match line;
    a first word line, the first word line substantially parallel with and adjacent to the first match line;
    a second match line, the second match line substantially parallel with and adjacent to the first word line; and
    a second word line, the second word line substantially parallel with and adjacent to the second match line.

11. A method of forming a memory cell for use in a content-addressable memory, the method comprising the steps of:
    forming a first latch, the first latch operative to store a first bit associated with a first stored word;
    forming a second latch, the second latch operative to store a second bit associated with a second stored word;
    forming a first logic gate, the first logic gate being coupled to the first latch; and
    forming a second logic gate, the second logic gate being coupled to the second latch;
    wherein the first and second latches collectively comprise a plurality of latch transistors, each of the plurality of latch transistors comprising a respective channel, the channels being oriented in substantially the same direction; and
    wherein the memory cell comprises a central portion in which the first and second latches are implemented, and first and second side portions arranged on opposite sides of the central portion, the first and second logic gates being implemented in the side portions.

12. An integrated circuit comprising a content-addressable memory, the content-addressable memory including a plurality of memory cells, at least one of the plurality of memory cells comprising:
    a first latch, the first latch operative to store a first bit associated with a first stored word;
    a second latch, the second latch operative to store a second bit associated with a second stored word;
    a first logic gate, the first logic gate coupled to the first latch; and
    a second logic gate, the second logic gate coupled to the second latch;
    wherein the first and second latches collectively comprise a plurality of latch transistors, each of the plurality of latch transistors comprising a respective channel, the channels being oriented in substantially the same direction; and
    wherein the memory cell comprises a central portion in which the first and second latches are implemented, and first and second side portions arranged on opposite sides of the central portion, the first and second logic gates being implemented in the side portions.

13. The integrated circuit of claim 12, wherein at least one of the first and second logic gates comprises a vertical via that is shared with a different memory cell in the plurality of memory cells.

14. The integrated circuit of claim 13, wherein the vertical via lands on a diffusion level.

15. The integrated circuit of claim 12, wherein the content-addressable memory comprises four or more memory cells, the four or more memory cells arranged in an array having a plurality of rows and a plurality of columns, each of the plurality of rows operative to store two words.

16. The integrated circuit of claim 15, wherein each of the plurality memory cells in a given row is coupled to two common word lines and to two common match lines.

17. The integrated circuit of claim 15, wherein each of the plurality memory cells in a given column is coupled to two common search lines and to two common bit lines.

18. The integrated circuit of claim 12, wherein the content-addressable memory is implemented with segmented bit lines.

19. An apparatus comprising a content-addressable memory, the content-addressable memory including a plurality of memory cells, at least one of the plurality of memory cells comprising:
- a first latch, the first latch operative to store a first bit associated with a first stored word;
- a second latch, the second latch operative to store a second bit associated with a second stored word;
- a first logic gate, the first logic gate coupled to the first latch; and
- a second logic gate, the second logic gate coupled to the second latch;
- wherein the first and second latches collectively comprise a plurality of latch transistors, each of the plurality of latch transistors comprising a respective channel, the channels being oriented in substantially the same direction; and
- wherein the memory cell comprises a central portion in which the first and second latches are implemented, and the first and second side portions arranged on opposite sides of the central portion, the first and second logic gates being implemented in the side portions.

20. The apparatus of claim 19, wherein the apparatus comprises at least one of a data networking device, a memory mapping device, and a data compression device.

* * * * *